(12) United States Patent
Liou

(10) Patent No.: US 8,164,732 B2
(45) Date of Patent: Apr. 24, 2012

(54) ACTIVE DEVICE ARRAY SUBSTRATE AND LIQUID CRYSTAL DISPLAY PANEL HAVING PARTICULAR VERTICALLY ARRANGED GATE LINES

(75) Inventor: Meng-Chi Liou, Taoyuan County (TW)

(73) Assignee: Chungwa Picture Tubes, Ltd., Taoyuan (TW)

( * ) Notice: Subject to any disclaimer, the term of this patent is extended or adjusted under 35 U.S.C. 154(b) by 521 days.

(21) Appl. No.: 12/488,595

(22) Filed: Jun. 22, 2009

(65) Prior Publication Data
US 2010/0244025 A1 Sep. 30, 2010

(30) Foreign Application Priority Data
Mar. 27, 2009 (TW) ............................... 98110250 A

(51) Int. Cl.
*G02F 1/1333* (2006.01)
*G02F 1/1343* (2006.01)

(52) U.S. Cl. ............................... 349/158; 349/38; 349/39

(58) Field of Classification Search .................. 349/158, 349/38, 39
See application file for complete search history.

(56) References Cited

U.S. PATENT DOCUMENTS
5,936,698 A * 8/1999 Koyama ........................ 349/187
* cited by examiner

*Primary Examiner* — Mike Qi
(74) *Attorney, Agent, or Firm* — Jianq Chyun IP Office

(57) ABSTRACT

An active device array substrate, having at least a substrate, a first metal layer, an insulator layer, a second metal layer, a plurality of pixel electrodes and a plurality of active devices, is provided. The substrate has a display area and a narrow frame area. The first metal layer disposed on the substrate includes a plurality of first gate lines arranged laterally. The insulator layer is disposed on the first metal layer. The second metal layer disposed above an insulator layer includes a plurality of data lines and second gate lines arranged vertically. The first gate lines and the data lines divide the display area into a plurality of pixel areas. The second gate line disposed between the pixel areas is electrically connected to the first gate line. Each pixel electrode is electrically connected to the data line and the first gate line via each active array device.

26 Claims, 8 Drawing Sheets

ACTIVE DEVICE ARRAY SUBSTRATE AND LIQUID CRYSTAL DISPLAY PANEL HAVING PARTICULAR VERTICALLY ARRANGED GATE LINES

CROSS-REFERENCE TO RELATED APPLICATION

This application claims the priority benefit of Taiwan application serial no. 98110250, filed on Mar. 27, 2009. The entirety of the above-mentioned patent application is hereby incorporated by reference herein and made a part of specification.

BACKGROUND OF THE INVENTION

1. Field of Invention

The present invention relates to an active device array substrate and a display panel. More particularly, the present invention relates to an active device array substrate with a narrow frame area and a display panel.

2. Description of Related Art

The progressive development of display technology mainly dues to the advancement of the technology of electro-optical and semiconductor devices. Among the various display media, the liquid crystal display panel (LCD panel) provides the favorable features of reduced size and weight, low power consumption, free radiation, full color and portable, etc.; hence, the LCD panel becomes increasingly popular and the mainstream of display panels.

FIG. 1 is a schematic diagram of a conventional LCD panel. FIG. 2 is a partially enlarged view of region C of the LCD panel in FIG. 1. FIG. 2 illustrates the wiring of the active device arrange substrate of the LCD panel 100.

Referring concurrently to FIGS. 1 and 2, the LCD panel 100 includes a display region A and a peripheral circuit region B, wherein the display region A is configured with gate lines 120 and data lines 140. This LCD panel 100 adopts an integrated driver IC 170 for driving the gate lines 120 and the data lines 140. The gate lines 120 and the data lines 140 divide the display region A into a plurality of pixel regions D. A pixel electrode 150 and an active device 160 are configured in each pixel region D. Further, the common lines 132 that pass through the pixel region D provide storage capacitance to the pixel electrodes 150 for stabilizing the data voltage of the pixel electrodes 150. Moreover, the common lines 132 are connected to a $V_{com}$ bus line 130.

Additionally, multiple electronic devices and circuits, such as electric static discharge guard 110 (ESD guard), inspection switch device (not shown), $V_{com}$ bus line 130, etc., are disposed in the peripheral circuit region B. It is worthy to note that the gate lines 120 in the display region A extend to the peripheral circuit region B. The gate lines 120 extend to and arrange vertically in the peripheral circuit region B. In FIG. 2, only three vertically extending gate lines 120 are illustrated. However, it should be appreciate that a great part of the peripheral circuit region is occupied by a multiple of vertically extending gate lines 120.

Referring to FIG. 1, assuming the resolution of this LCD panel is 320 (V)×240 (H), each peripheral circuit region B at the right and left sides of the LCD panel 100 respectively accommodates at least 160 gate lines 120. More particularly, referring to FIG. 2, according to the LCD panel 100 array fabrication process and the fabrication capability of an exposure machine, if the line width "d" of the gate line 120 and the distance "w" between two gate lines 120 are both 4 micron (μm), the peripheral circuit region B at least requires to have a width of 0.004×2×160=1.28 millimeter (mm) to accommodate all these gate lines 120. If other ESD guards 110, $V_{com}$ bus lines 130 are to be included in the peripheral circuit region B, the width of the entire the peripheral circuit region B may exceed 2 millimeter (mm). As the resolution of the LCD panel 100 increases, the number of required gate lines 120 increases accordingly. Hence, more space is required in the peripheral circuit region B to accommodate these vertically arranged gate lines 120 and the multiple of electronic devices. Hence, the peripheral circuit region B of the LCD panel 100 can not be further reduced.

Further, although the common lines 132 are used to provide storage capacitor for the pixel electrodes 150, the stability of the storage capacitor is inadequate. Ultimately, the problems of flicker and cross talk are generated.

SUMMARY OF THE INVENTION

In view of the foregoing, the present invention provides an active device array substrate having a narrow peripheral circuit region (also known as the narrow frame area), and a stable storage capacitor.

The present invention also provides a liquid crystal display (LCD) panel that includes an active device array substrate having the above-mentioned narrow frame area. Not only the space occupied by the peripheral circuit region is reduced, a stable storage capacitor is provided to enhance the display quality of the LCD panel.

Accordingly, the present invention provides a liquid crystal display panel that includes a substrate, a first metal layer, an insulation layer, a second metal layer, a passivation layer, a plurality of pixel electrodes and a plurality of active devices. The substrate includes a display region and a narrow frame area at the periphery of the display region. The first metal layer disposed above the substrate includes a plurality of laterally arranged first gate lines. The insulation layer is disposed above the first metal layer. The second metal layer disposed above the insulation layer includes a plurality of vertically arranged data lines and a plurality of vertically arranged second gate lines. The first gate lines and the data lines divide the display region into a plurality of pixel regions. The second gate lines are disposed at the display region, and these second gate lines are disposed between the pixel regions and electrically connected to the corresponding first gate lines. The passivation layer is disposed above the second metal layer. The pixel electrodes are disposed above the passivation layer, and each pixel electrode is disposed at each pixel region. Each active device is disposed at each pixel region, and each pixel electrode is electrically connected to each corresponding data line and each corresponding first gate line through each active device.

The present invention provides a liquid crystal display panel that includes the above-mentioned active device array substrate, a color filter substrate and a liquid crystal layer. The color filter substrate is disposed opposite to the active device array substrate. The liquid crystal layer is disposed between the active device array substrate and the color filter substrate.

In an aspect of the invention, the above first metal layer further includes a plurality of vertically arranged third gate lines. Each third gate line is positioned directly under each data line, and is electrically connected to each corresponding second gate line.

In another aspect of the invention, the above insulation layer includes a plurality of contact windows, each third gate line is electrically connected to each corresponding second gate line through the contact windows.

In another aspect of the invention, the above first metal layer further includes a plurality of first common lines, laterally extending across the pixel region. Each first common line, the insulation layer and the passivation layer in the corresponding pixel region, and each pixel electrode form a first storage capacitor.

In another aspect of the invention, the above second metal layer further includes a plurality of second common lines, vertically extending across the pixel regions. Each second common line, the passivation layer in each corresponding pixel region and each pixel electrode form a second storage capacitor.

In another aspect of the invention, the active device array substrate further includes a channel layer and an ohmic contact layer configured above the channel layer, wherein the channel layer and the ohmic contact layer are sequentially disposed between the insulation layer and the second metal layer.

In another aspect of the invention, the first metal layer also includes a plurality of gates, each gate is electrically connected to each corresponding first gate line. The above second metal layer also includes a plurality of sources and a plurality of drains, wherein each source is electrically connected to each corresponding date line, and each drain is electrically connected to each corresponding pixel electrode. Each gate, each source and each drain form each active device.

In another aspect of the invention, the above passivation layer includes a plurality of contact windows, wherein the pixel electrodes are electrically connected the corresponding first gate lines through these contact windows.

In another aspect of the invention, the above active device array substrate further includes an electric static discharge guard configured at the narrow frame area.

In another aspect of the invention, the above active device array substrate further includes a $V_{com}$ bus line at the narrow frame area.

In another aspect of the invention, the above active device array substrate further includes an inspection switch device at the narrow frame area.

According to the active device array substrate of an aspect of the present invention, the first gate lines and the second gate lines are fabricated in the display region, and the first gate lines and the second gate lines are respectively fabricated using the first metal layer and the second metal layer. Further, the first gate lines and the second gate lines are electrically connected through a contact window. Hence, the peripheral circuit region of the active device array substrate is precluded of forming an exceeding number of gate lines to better preserve the space of the peripheral circuit region of the active device array substrate. Moreover, because the common lines are vertically extended, a greater storage capacitance is resulted between the common lines and the pixel electrodes. Moreover, a portion of the second gate lines positioned in the display region can be replaced with the data lines concealed directly under the third gate lines to enhance the aperture ratio of the active device array substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Active Device Array Substrate
First Embodiment

Figure 3:
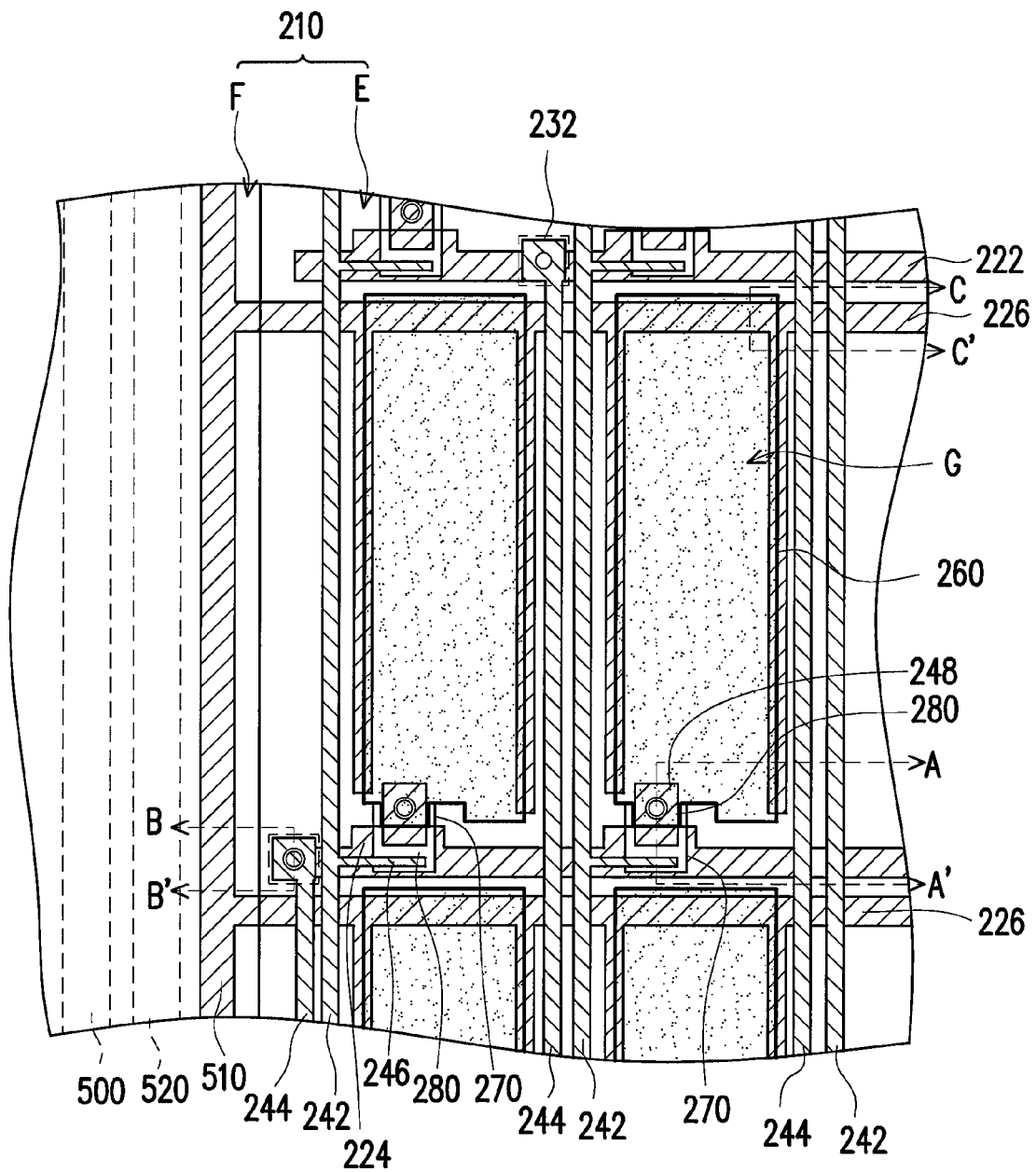
FIG. 3 is a partial top view diagram of an active device array substrate of a first exemplary embodiment of the invention.
Figure 4:
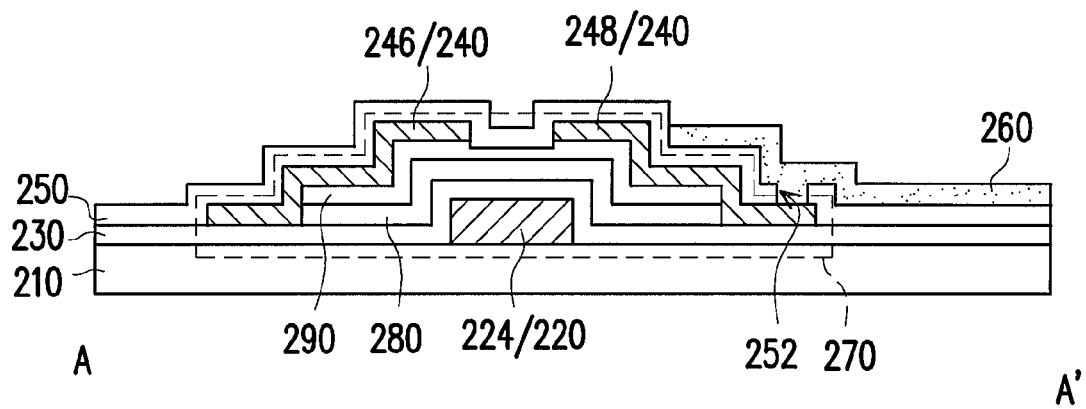
FIG. 4 is a schematic, cross-sectional view of the active device array substrate in FIG. 3, along the A-A' line.

FIG. 3 is a partial top view diagram of an active device array substrate of a first exemplary embodiment of the invention. FIG. 4 is a cross-sectional view of the active device array substrate in FIG. 3, along the A-A' line. Reference now is made to FIG. 3 to describe the components in forming the active device array substrate and to FIG. 4 to describe the disposition relationship between each film layer of the active device array substrate in FIG. 3. In FIG. 4, for the devices that belong to the first metal layer 220, using gate 224 as an example, the reference number of the gate is 224/220. Similarly, the devices that belong to the second metal layer 240 are reference numbered accordingly.

Referring concurrently to FIGS. 3 and 4, the active device array substrate 200 includes a substrate 210, a first metal layer 220, an insulation layer 230, a second metal layer 240, a passivation layer 250, a plurality of pixel electrodes 260 and a plurality of active devices 270. The substrate 210 includes a display area E and a narrow frame area F at the periphery of the display area E. The first metal layer 220, configured above the substrate 210, includes a plurality of laterally arranged first gate metal lines 222. The insulation layer 230 is disposed above the first metal layer 220. The second metal layer 240 is configured above the insulation layer 230, and the second metal layer 240 includes a plurality of data lines 242 and a plurality of vertically arranged second gate lines 244. The first gate lines 222 and the data lines 242 divide the display area E into a plurality of pixel regions G. The second gate lines 224 are disposed in the display area E, and these second gate lines 224 disposed between the pixel regions G are electrically connected to the corresponding first gate lines 222. The passivation layer 250 is disposed above the second metal layer 240. The pixel electrodes 260 are disposed above the passivation layer 250, and each pixel electrode 260 and each active device 270 are disposed in each pixel region G, wherein each pixel electrode 260 is electrically connected to each corresponding data line 232 and each corresponding first gate line 222 via each active device 270.

Figure 5:
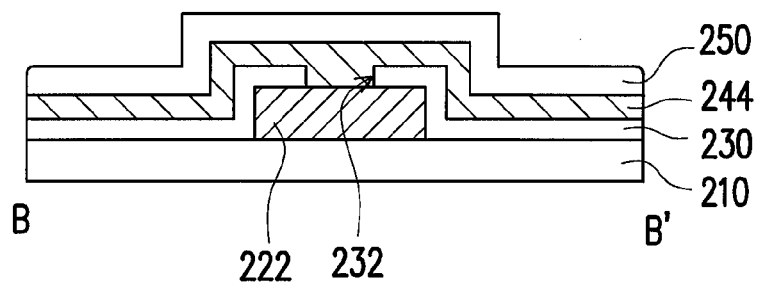
FIG. 5 is a schematic, cross-sectional view of the active device array substrate in FIG. 3, along the line B-B'.

It is worth noting that in this active device array substrate 200, the second gate lines 244 are disposed in the display regions, E and are in between the pixel regions G, and the second gate lines 244 (belonging to the second metal layer 240) are electrically connected to the first gate lines 222 (belonging to the first metal layer 220) via contact window. More specifically, referring to FIG. 5, wherein FIG. 5 is a cross-sectional view of the active device array substrate in FIG. 3, along the B-B' line. Referring concurrently to FIGS. 3 and 5, the insulation layer 230 includes a plurality of contact windows 232; hence, the second gate lines 244 of the second metal layer 240 are electrically connected the corresponding first gate lines 222 of the first metal layer 220 through the contact windows 232.

Figure 1:
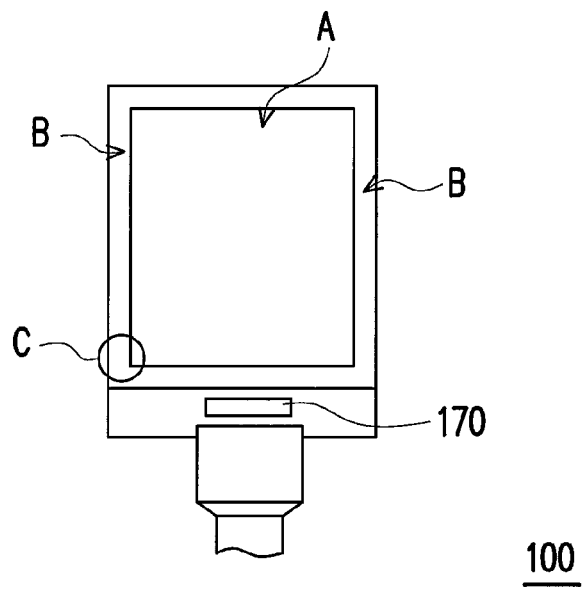
FIG. 1 is a schematic diagram of a conventional liquid crystal display panel.
Figure 2:
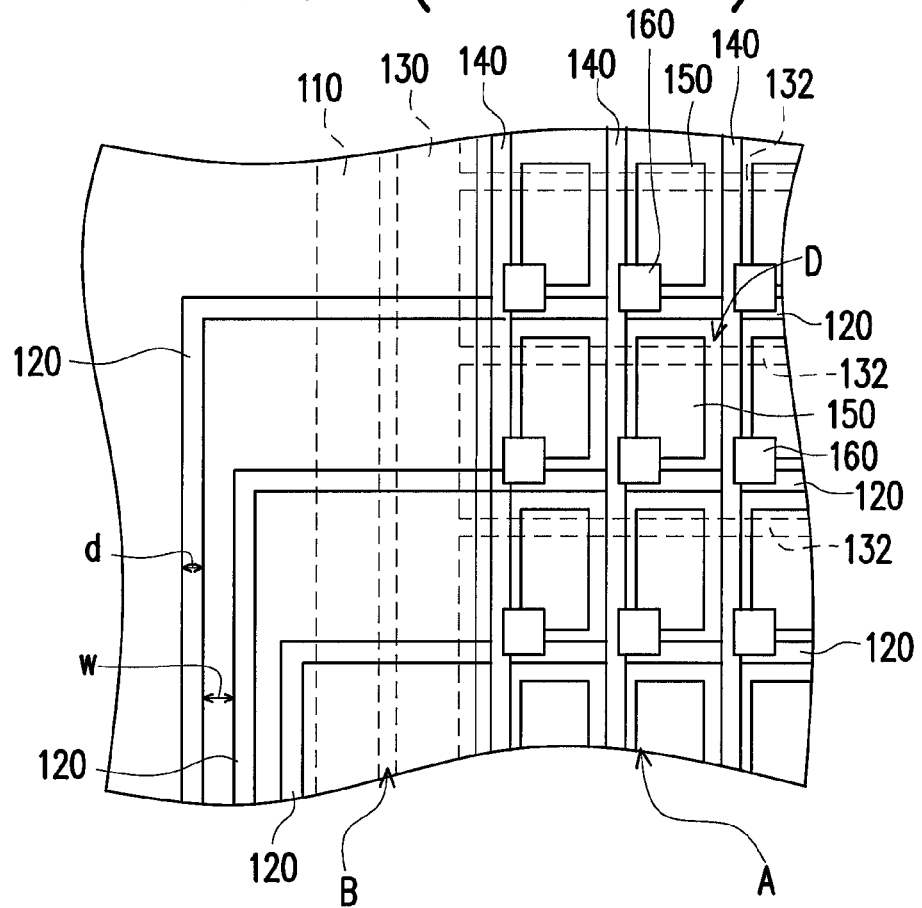
FIG. 2 is an enlarged view of region C of the LCD panel in FIG. 1.

Comparing with the conventional active device array substrate of the LCD display panel 100 illustrated in FIG. 2, no excess gate lines (the second gate lines 244 are disposed within the display region E) are disposed at the narrow frame area F of the active array substrate 200 of the invention. The area reserved for the narrow frame area F can be reduced.

Continuing to FIG. 4, the active device array substrate 200 further includes a channel layer 280 and an ohmic contact layer 290 above the channel layer 280 sequentially disposed between the insulation layer 230 and the second metal layer 240. The channel layer 280 may be an amorphous silicon layer, for example, used in providing a channel for electron conduction. The ohmic contact layer 290 may be, for example, an N-type doped amorphous silicon layer, and is used to lower the resistance between the second metal layer 240 (source electrode 2461240, drain electrode 248/240) and the channel layer 280.

Moreover, referring to both FIGS. 3 and 4, the first metal layer 220 may also includes a plurality of gates 224, and each gate 224 is electrically connected to a corresponding first gate line 222. The second metal layer 240 may also include a plurality of source 246 and a plurality of drain 248, and each source 246 is electrically connected to each data line 242 correspondingly, while each drain 248 is electrically connected to pixel electrode 260 correspondingly. Further, each gate 224, each source and each drain 248 form each active device 270. Moreover, the passivation layer 250 may include a plurality of contact windows 252, and the pixel electrodes 260 are electrically connected to the corresponding drain 248 through the contact windows 252.

Figure 6:
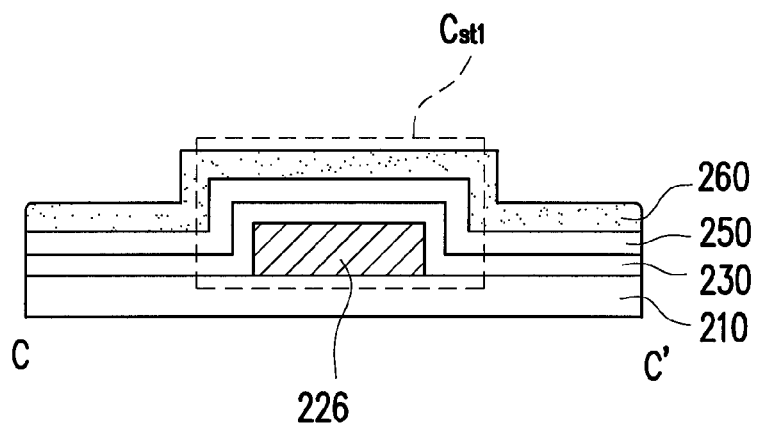
FIG. 6 is a schematic, cross-sectional view of the active device array substrate in FIG. 3 along the C-C'.

FIG. 6 is a schematic, cross-sectional view of the active device array substrate in FIG. 3 along the C-C' line. Referring to both FIGS. 6 and 3, the first metal layer 220 may include a plurality of first common lines 226, laterally extending across the pixel region G, and each first common line 226, the insulation layer 230 and the passivation layer 250 configured in the pixel region G, and each pixel electrode 260 form a first capacitor electrode Cst1 for providing the required storage capacitance during the display and improving the display quality.

Referring again to FIG. 3, this active device array substrate 200 may further include an electric static discharge guard 500, a $V_{com}$ bus line 510, and an inspection switch device 520 disposed at the narrow frame area F. The $V_{com}$ bus line 510 provides a common voltage signal $V_{com}$ to the first common lines 226 in the display region E. The electric static discharge guard 500 serves to prevent damages to the circuit of the active device array substrate 200 due to static discharge. The inspection switch device 520 is electrically connected in between an inspection apparatus (not shown) with the circuit of the display region E of the active device array substrate 200 for determining the normality of the display of the active device array substrate 200.

Accordingly, no excess number of gate line is disposed at the narrow frame area F of the active device array substrate 200 of the invention (in other words, the second gate lines 244 are disposed within the display region E) and the area reserved for the narrow frame F can be reduced.

Second Exemplary Embodiment

Figure 7:
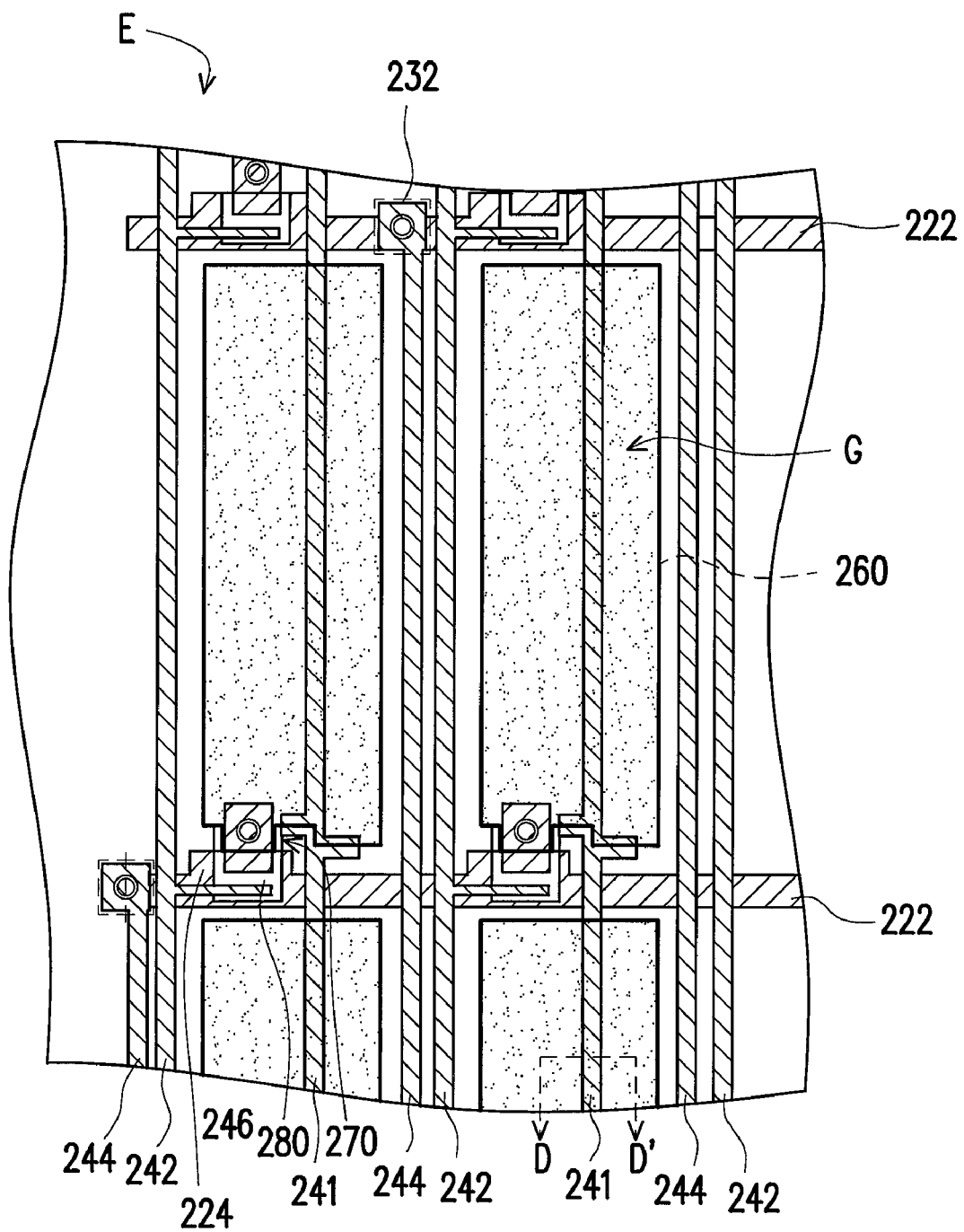
FIG. 7 is a partial top view of an active device array substrate according to a second exemplary embodiment of the invention.
Figure 8:
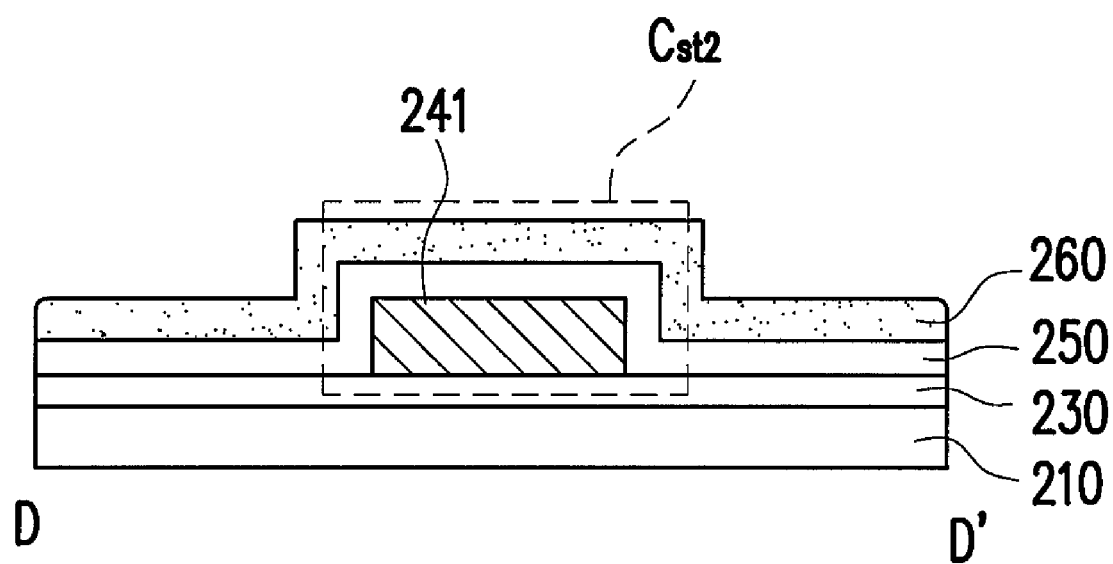
FIG. 8 is a schematic, cross-sectional view of the active device array substrate in FIG. 7 along the line D-D'.

It should be appreciated that the present invention does not particularly limit the disposition orientation of the common lines on active device array substrate. FIG. 7 is a partial top view of an active device array substrate according to a second exemplary embodiment of the invention. The partial view illustrates the part of the display region E, while the part of the narrow frame F is excluded. FIG. 8 is a cross-sectional view of the active device array substrate in FIG. 7 along the D-D' line.

Referring concurrently to FIGS. 7 and 8, a difference between the active device array substrate 300 of this exemplary embodiment and that of the first exemplary embodiment is that in the active device array substrate 300 of the second exemplary embodiment of the invention, the second metal layer 240 further includes a plurality of second common lines 241, vertically extending across the pixel region G, and each second common line 241, the passivation layer 250 in the pixel region G, and each pixel electrode 260 form a second storage capacitor Cst2.

It is worth noting that, as shown in FIG. 7, since the second common lines 241 extend vertically across the pixel electrodes 260, the area of the pixel electrodes 260 that is being passed through by the second common lines 241 is greater than the area of the pixel electrodes 260 that is being passed through by the first common lines 226 as shown in FIG. 3. Accordingly, the capacitor voltage provided by the second storage capacitor Cst2 is greater than that provided by the first storage capacitor Cst1. Hence, the voltage in the display region E is more stable, and the problems of flicker and cross talk are solved. Further, the second common lines 241 may form during the formation of the second metal layer 240 (data lines 242, source 246, drain 248). Hence, no exceptional burden is imposed on the fabrication process.

Third Exemplary Embodiment

Figure 9:
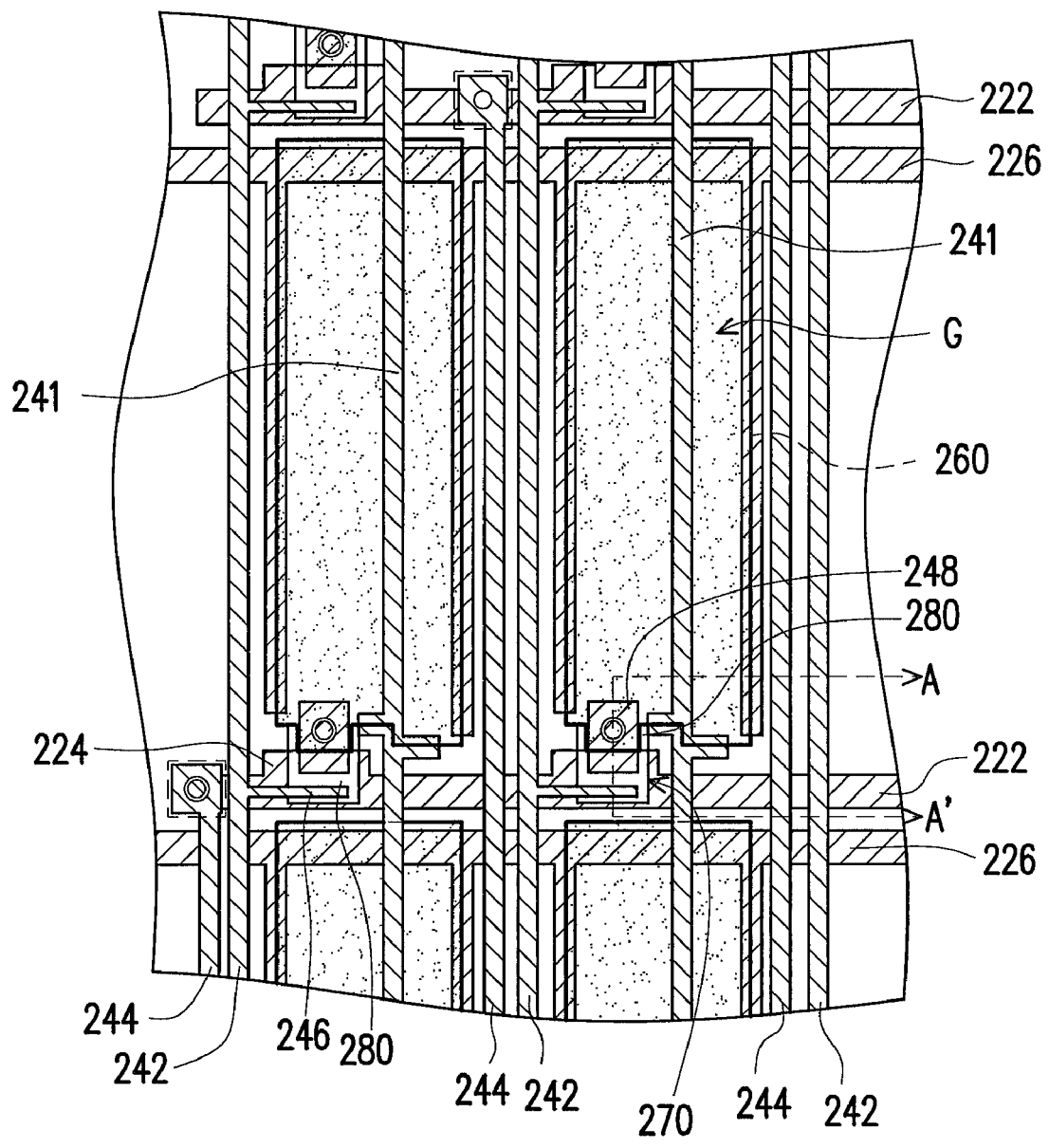
FIG. 9 is a partial top view of an active device array substrate according to a third exemplary embodiment of the invention.

In another exemplary embodiment of the invention, the laterally extending first common lines 226 and the vertically extending second common lines 241 may configure concurrently. FIG. 9 is a partial top view of an active device array substrate according to a third exemplary embodiment of the invention. In FIG. 9, only the part of the display region E is illustrated, while the part of the narrow frame area F is excluded. Referring to FIG. 9, this active device array substrate 400 includes a plurality of laterally extending first common lines 226 and a plurality of vertically extending second common lines 241. Hence, an additive effect of the first storage capacitor Cst1 and the second storage capacitor Cst2 is resulted to better stabilize the voltage of the display region E and to further improve the display quality.

Fourth Exemplary Embodiment

Figure 10:
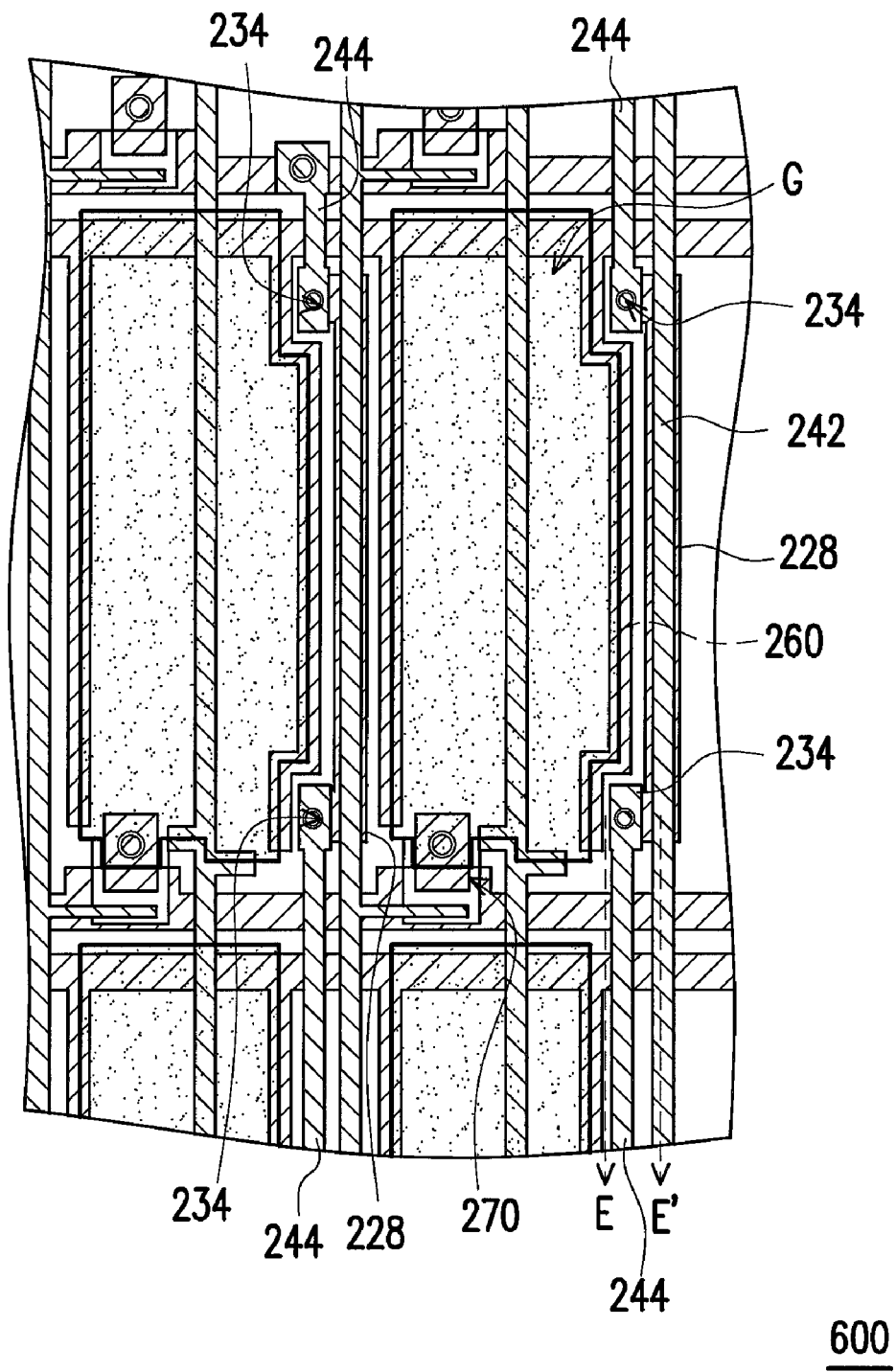
FIG. 10 is a partial top view of an active device array substrate according to a fourth exemplary embodiment of the invention.
Figure 11:
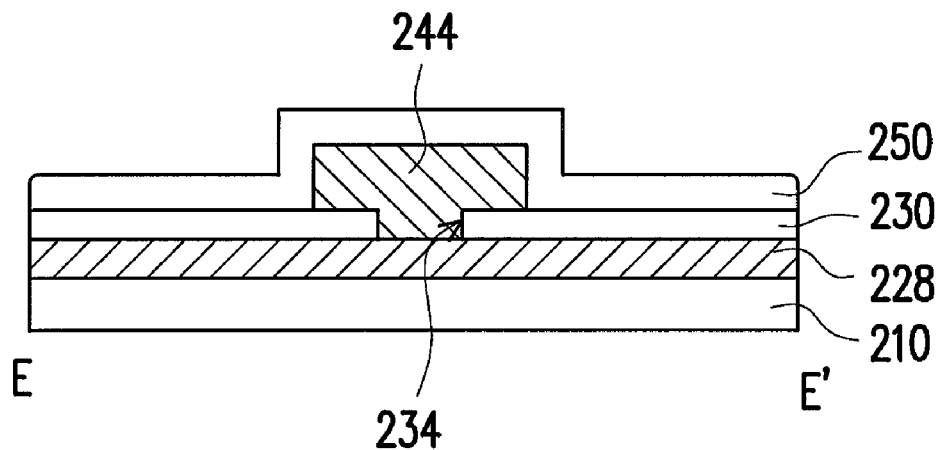
FIG. 11 is a cross-sectional view of the active device array substrate in FIG. 10 along the E-E' line.

FIG. 10 is a partial top view of an active device array substrate according to a fourth exemplary embodiment of the invention. FIG. 11 is a cross-sectional view of the active device array substrate in FIG. 10 along the E-E' line. Referring to both FIGS. 10 and 11, the first metal layer 220 of this active device array substrate 600 further includes a plurality of vertically arranged third gate lines 228, and each third gate line 228 is disposed under each data line 242. Further, each third gate line 228 is electrically connected to each corresponding second gate line 244. Moreover, as shown in FIG. 11, the insulation layer 230 may include a plurality of contact windows 234, and each third gate line 228 is electrically connected to each corresponding second gate line 244 through the contact windows 234 to provide the between-layers connection.

In this exemplary embodiment, a part of the vertically extend gate lines (the third gate line 228 shown in FIG. 10) is concealed under, for example, hidden directly under, the data lines 242. Hence, the area of the pixel regions G occupied by the gate lines is reduced. Alternatively speaking, each pixel region G shown in FIG. 10 is bigger than each pixel region G in the first to the third exemplary embodiments. In essence, the aperture ratio of the pixel region G of the active device array substrate 600 is larger.

Liquid Crystal Display Panel

Figure 12:
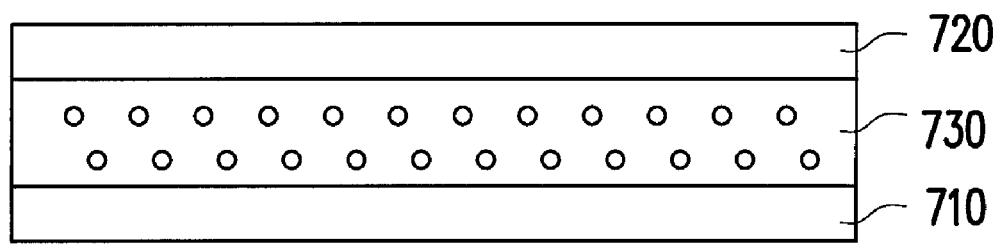
FIG. 12 is a schematic, cross-sectional view of a LCD panel according to an exemplary embodiment of the invention.

FIG. 12 is a cross-sectional view of a LCD panel according to an exemplary embodiment of the invention. Referring to FIG. 12, this liquid crystal display panel 700 includes an active device array substrate 710, a color filter substrate 720 and a liquid crystal layer 730. The color filter substrate 720 is disposed opposite to the active device array substrate 710. The liquid crystal layer 730 is disposed between the active device array substrate 710 and the color filter substrate 720.

It is worthy to note that the active device array substrate 710 may adopt any one of the active device array substrates 200, 300, 400, 600 described in the first to the fourth exemplary embodiments. The detail components of the active device array substrate have been previously described and will not be further reiterated. The color filter layer substrate 720 may include a black matrix (not shown), a color filter layer (not shown) and a common electrode (not shown).

Accordingly, only the $V_{com}$ bus line 510, the inspection switch device 520 and the electric static discharge guard 500, etc. are disposed at the narrow frame area of the liquid crystal display panel 700, and no gate lines are configured at the narrow frame area of the LCD panel 700. Moreover, since the vertically extending second common lines 241 are used, the capacitance is increased to improve the display quality of the LCD panel 700.

According to the various aspects of the invention, the second gate lines are disposed in the display region, and the disposition of gate lines in the peripheral circuit region of the active device array substrate is precluded. Hence, the occupancy of the peripheral circuit region is reduced to result with a narrower frame. Moreover, the second gate lines may form concurrently during the processing of the second metal layer, no exceptional burden is imposed on the fabrication process. Further, the active device array substrate comprises the vertically extending second common lines that may provide a stable storage voltage to the active device array substrate and improve the display quality of the LCD panel. Additionally, a part of the second gate lines in the display region is replaced by the third gate lines hidden directly under the data lines to increase the aperture ratio of the active device array substrate.

Although the disclosure herein refers to certain illustrated embodiments, it is to be understood that these embodiments are presented by way of example and not by way of limitation. The intent of the detailed description is to cover all modifications, alternatives, and equivalents as may fall within the spirit and scope of the invention as defined by the appended claims. Moreover, any embodiment of the invention or claims to achieve all the features, advantages or characteristics disclosed in the invention. Additionally, the abstract and the title of the invention are intended to facilitate patent search and not intended to be restrictive of the spirit and scope of the invention.

What is claimed is:

1. An active device array substrate, comprising:
    a substrate, comprising a display region and a narrow frame area at a periphery of the display region; and
    a first metal layer, disposed over the substrate, and the first metal layer comprising:
        a plurality of laterally arranged first gate lines; and
        an insulation layer, disposed above the first metal layer; and
    a second metal layer, disposed above the insulation layer, and the second metal layer comprising:
        a plurality of vertically arranged data lines, and the plurality of first gate lines and the plurality of data lines divide the display region into a plurality of pixel regions; and
        a plurality of vertically arranged second gate lines, disposed in the display region, and the plurality of second gate lines are disposed between the plurality of pixel regions and are electrically connected to the plurality of first gate lines correspondingly; and
    a passivation layer, disposed above the second metal layer;
    a plurality of pixel electrodes, disposed above the passivation layer and the plurality of pixel electrodes are respectively configured at the plurality of pixel regions; and
    a plurality of active devices, each of the plurality of the active devices is configured at each of the plurality of the pixel regions, and each of the plurality of the pixel electrodes is electrically connected to each of the plurality of data lines and each of the plurality of first gate lines correspondingly through each of the plurality of active devices.

2. The active device array substrate of claim 1, wherein the first metal layer further comprises:
    a plurality of vertically arranged third gate lines, each of the plurality of third gate lines is positioned directly under each of the plurality of data lines, and each of the plurality of third gate lines is electrically connected to each of the plurality of second gate lines correspondingly.

3. The active device array substrate of claim 2, wherein the insulation layer comprises a plurality of contact windows, and each of the plurality of third gate lines are electrically connected to each of the plurality of second gate lines correspondingly through each of the plurality of contact windows.

4. The active device array substrate of claim 1, wherein the first metal layer further comprises:
    a plurality of first common lines, laterally extending across the pixel electrodes, and each of the plurality of first common lines, the insulation layer and the passivation layer positioned in the corresponding pixel region, and each of the plurality of pixel electrodes form a first storage capacitor.

5. The active device array substrate of claim 4, wherein the second metal layer further comprises:
    a plurality of second common lines, vertically extending across the pixel electrodes, and each of the plurality of the second common lines, the passivation layer configured in the corresponding pixel region, and each of the plurality of pixel electrodes form a second storage capacitor.

6. The active device array substrate of claim 1, wherein the second metal layer further comprises:
    a plurality of second common lines, vertically extending across the pixel regions, and each of the plurality of second common lines, the passivation layer in the corresponding pixel region, and each of the plurality of the pixel electrodes form a second storage capacitor.

7. The active device array substrate of claim 1 further comprising a channel layer and an ohmic contact layer disposed above the channel layer, sequentially disposed between the insulation layer and the second metal layer.

8. The active device array substrate of claim 1, wherein
the first metal layer further comprises a plurality of gates, each of the plurality of gates is electrically connected to each of the plurality of first gate lines correspondingly; and
the second metal layer further comprises a plurality of sources and a plurality of drains, and each of the plurality of sources is electrically connected to each of the plurality of data lines correspondingly, and each of the plurality of drains is electrically connected to each of the plurality of pixel electrodes correspondingly;
wherein, each of the plurality of gates, each of the plurality of sources and each of the plurality of drains form each of a plurality of active devices.

9. The active device array substrate of claim 8, wherein the passivation layer comprises a plurality of contact windows, and the plurality of pixel electrodes are electrically connected to the plurality of drains correspondingly through the plurality of contact windows.

10. The active device array substrate of claim 1, wherein the insulation layer comprises a plurality of contact windows, and the plurality of second gate lines are electrically connected to the plurality of first gate lines correspondingly through the plurality of contact windows.

11. The active device array substrate of claim 1 further comprising an electric static discharge guard disposed at the narrow frame area.

12. The active device array substrate of claim 1 further comprising a common voltage bus line disposed at the narrow frame area.

13. The active device array substrate of claim 1 further comprising an inspection switch device disposed at the narrow frame area.

14. A liquid crystal display panel, comprising:
an active device array substrate, comprising:
a substrate, comprising a display region and a narrow frame area at a periphery of the display region; and
a first metal layer, disposed over the substrate, and the first metal layer comprising:
a plurality of laterally arranged first gate lines; and
an insulation layer, disposed above the first metal layer; and
a second metal layer, disposed above the insulation layer, and the second metal layer comprising:
a plurality of vertically arranged data lines, and the plurality of first gate lines and the plurality of data lines divide the display region into a plurality of pixel regions; and
a plurality of vertically arranged second gate lines, disposed in the display region, and the plurality of second gate lines are disposed between the plurality of pixel regions and are electrically connected to the plurality of first gate lines correspondingly; and
a passivation layer, disposed above the second metal layer;
a plurality of pixel electrodes, disposed above the passivation layer and each of the plurality of pixel electrodes is respectively configured in each of the plurality of pixel regions;
a plurality of active devices, each of the plurality of the active devices is configured at each of the plurality of the pixel regions, and each of the plurality of the pixel electrodes is electrically connected to each of the data lines and each of the first gate lines correspondingly through each of the plurality of active devices; and
a color filter substrate, disposed opposite to the active device array substrate; and
a liquid crystal layer, disposed between the active device array substrate and the color filter substrate.

15. The liquid crystal display panel of claim 14, wherein the first metal layer further comprises:
a plurality of vertically arranged third gate lines, each of the plurality of third gate lines is positioned directly under each of the plurality of data lines, and each of the third gate lines is electrically connected to each of the second gate lines correspondingly.

16. The liquid crystal display panel of claim 15, wherein the insulation layer comprises a plurality of contact windows, and each of the plurality of third gate lines is electrically connected to each of the plurality of second gate lines correspondingly through each of the plurality of contact windows.

17. The liquid crystal display panel of claim 14, wherein the first metal layer further comprises:
a plurality of first common lines, laterally extending across the pixel electrodes, and each of the plurality of first common lines, the insulation layer and the passivation layer positioned in the corresponding pixel region, and the each of the plurality of pixel electrodes form a first storage capacitor.

18. The liquid crystal display panel of claim 17, wherein the second metal layer further comprises:
a plurality of second common lines, vertically extending across the plurality of pixel electrodes, and each of the plurality of the second common lines, the passivation layer configured in each corresponding pixel region, and each of the plurality of the pixel electrodes form a second storage capacitor.

19. The liquid crystal display panel of claim 14, wherein the second metal layer further comprises:
a plurality of second common lines, vertically extending across the pixel regions, and each of the plurality of second common lines, the passivation layer at each corresponding pixel region, and each of the plurality of the pixel electrodes form a second storage capacitor.

20. The liquid crystal display panel of claim 14, wherein the active device array substrate further comprises a channel layer and an ohmic contact layer configured above the channel layer, sequentially disposed between the insulation layer and the second metal layer.

21. The liquid crystal display panel of claim 14, wherein
the first metal layer further comprises a plurality of gates, each of the plurality of gates is electrically connected to each of the first gate lines correspondingly; and
the second metal layer further comprises a plurality of sources and a plurality of drains, and each of the plurality of sources is electrically connected to each of the plurality of data lines correspondingly, and each of the plurality of drains is electrically connected to each of the plurality of pixel electrodes correspondingly;
wherein, each of the plurality of gates, each of the plurality of sources and each of the plurality of drains form each of the plurality of active devices.

22. The liquid crystal display panel of claim 21, wherein the passivation layer comprises a plurality of contact windows, and the plurality of pixel electrodes are electrically connected to the plurality of drains correspondingly through the plurality of contact windows.

23. The liquid crystal display panel of claim 14, wherein the insulation layer comprises a plurality of contact windows, and the plurality of second gate lines are electrically connected to the plurality of first gate lines correspondingly through the plurality of contact windows.

24. The active device array substrate of claim 14 further comprising an electric static discharge guard disposed at the narrow frame area.

25. The active device array substrate of claim 14 further comprising a common voltage bus line disposed at the narrow frame area.

26. The active device array substrate of claim 14 further comprising an inspection switch device disposed at the narrow frame area.

* * * * *

UNITED STATES PATENT AND TRADEMARK OFFICE
CERTIFICATE OF CORRECTION

PATENT NO. : 8,164,732 B2  
APPLICATION NO. : 12/488595  
DATED : April 24, 2012  
INVENTOR(S) : Meng-Chi Liou It is certified that error appears in the above-identified patent and that said Letters Patent is hereby corrected as shown below:

On the Title page of the patent grant, the item (73) Assignee's Name
"Chungwa Picture Tubes, Ltd." should be changed to --Chunghwa Picture Tubes, Ltd.--.

Signed and Sealed this
Nineteenth Day of June, 2012

David J. Kappos
*Director of the United States Patent and Trademark Office*